United States Patent [19]
Sethi et al.

[11] Patent Number: 5,844,271
[45] Date of Patent: Dec. 1, 1998

[54] SINGLE LAYER POLYCRYSTALLINE SILICON SPLIT-GATE EEPROM CELL HAVING A BURIED CONTROL GATE

[75] Inventors: Rakesh Sethi, Campbell; Wenchi Ting, San Jose, both of Calif.

[73] Assignee: Cypress Semiconductor Corp., San Jose, Calif.

[21] Appl. No.: 517,495

[22] Filed: Aug. 21, 1995

[51] Int. Cl.⁶ .................................................. H01L 29/788
[52] U.S. Cl. ............................................ 257/318; 257/315
[58] Field of Search ....................................... 257/318, 315

[56] References Cited

U.S. PATENT DOCUMENTS

| | | |
|---|---|---|
| 3,719,866 | 3/1973 | Naber et al. . |
| 4,611,308 | 9/1986 | Lonky . |
| 4,642,881 | 2/1987 | Matsukawa et al. . |
| 4,649,520 | 3/1987 | Eitan . |
| 4,870,304 | 9/1989 | Bloker et al. . |
| 4,935,802 | 6/1990 | Noguchi et al. . |
| 4,970,565 | 11/1990 | Wu et al. ................................ 257/318 |
| 5,258,634 | 11/1993 | Yang . |
| 5,284,786 | 2/1994 | Sethi . |
| 5,323,039 | 6/1994 | Asano et al. . |
| 5,326,999 | 7/1994 | Kim et al. . |
| 5,343,424 | 8/1994 | Chang et al. . |
| 5,404,037 | 4/1995 | Manley . |
| 5,427,968 | 6/1995 | Hong . |
| 5,502,321 | 3/1996 | Matsushita . |

*Primary Examiner*—Stephen Meier
*Attorney, Agent, or Firm*—Maiorana & Acosta, P.C.

[57] ABSTRACT

An electrically-erasable programmable read-only memory (EEPROM) cell includes a split-gate read transistor and a buried N-plate control gate. The split gate transistor includes a drain and source regions formed in a P-type silicon substrate with a channel formed therebetween. Silicon dioxide is disposed over the drain, channel and source regions wherein the oxide overlying the drain and a portion of the channel is thicker compared to the thickness of the oxide overlying the remainder of the channel and the source. A layer of polycrystalline silicon is disposed over the channel. The buried N-plate control gate is spaced laterally from the source, drain, and channel regions. The floating gate overlying the channel extends also over the buried N-plate control gate. The split gate structure effectively realizes a pair of in-series gates, each having a different threshold voltage in accordance with the thickness of the oxide used. The voltages applied to the N-plate region are capacitively coupled to the floating gate. The potential on the floating gate in turn causes activation of the transistors formed by the split-gate structure, depending on the existing charge on the floating gate.

12 Claims, 3 Drawing Sheets

SINGLE LAYER POLYCRYSTALLINE SILICON SPLIT-GATE EEPROM CELL HAVING A BURIED CONTROL GATE

BACKGROUND OF THE INVENTION

1. Field of the Invention

The present invention relates to integrated circuit memory devices and, more particularly, to an electrically-erasable programmable read-only memory (EEPROM) cells with a single poly split-gate having a buried plate control gate.

2. Description of the Related Art

More efficient utilization of device area, speed of storage/retrieval operations, design complexity and manufacturing complexity (which relate to cost) are all prominent objectives in very large scale integration (VLSI) design, particularly in the area of non-volatile memory devices (i.e., a type of memory device that retains stored data even after power to the device has been removed).

In particular, a conventional EEPROM device includes a plurality of memory cells, each memory cell including a storage transistor having a so-called floating gate. Such storage transistors have, as one characteristic, the ability to maintain information written thereto in the absence of a power source for the EEPROM device, and, moreover, are capable of having the data stored in the storage transistor erased. More specifically, the basic operation of a conventional, so-called flash EEPROM memory cell is well-known: i.e., use of Channel Hot Electron Injection for programming, and, use of Fowler-Nordhiem tunneling for erasure. In a flash EEPROM semiconductor device that includes an array of cells, each cell can be independently programmed and read. However, in an effort to reduce the size of each cell (and thereby increase the memory capacity per device), select transistors were frequently omitted that had enabled cells to be erased independently. Accordingly, all cells were erased together as a block.

A problem arising from this configuration became known as the "over-erasure" problem to those in the art. Specifically, during erasure, some cells of the block being erased become over-erased before other cells become sufficiently erased. The floating gates of the "over-erased" cells therefore become depleted of electrons and thus acquire a net positive charge. This net positive charge causes the "over-erased" cell to function as a depletion mode transistor—a transistor that cannot be turned off by application of normal operating voltages. This condition gives rise to leakage currents during subsequent read operations which can adversely effect the integrity of the memory device.

One approach to the "over-erasure" problem of conventional EEPROM devices is to provide a split-gate structure. Conventional split-gate structures are formed using at least two layers of polycrystalline silicon (hereinafter "poly"), and include a floating gate transistor. The first layer of poly forms a floating gate; however, the floating gate only covers a portion of a channel region between a source and drain. The remainder of the channel region is directly controlled by a second layer of poly—the control gate which also overlies the floating gate. The conventional split-gate memory cell configuration is thus equivalent to a series-connected isolation transistor and a floating gate transistor. The isolation transistor is not influenced by the state of the floating gate and will remain off when its control gate is not activated (i.e., when the memory cell is unselected), even if the floating gate transistor has been "over-erased" and is therefore in a conductive state. The integrity of the memory device can therefore be maintained, notwithstanding the above-mentioned "over-erasure" problem. However, this solution to the "over-erasure" problem requires two layers of poly and thus the complexity (and further, cost) is increased.

A second approach taken by others in the art has been to use a separate isolation or access transistor in the read path to prevent leakage currents during read operations for unselected cells. This approach is shown in FIG. 1, wherein a conventional EEPROM memory cell 10 is illustrated. The cell 10 includes a high voltage access transistor 12, a tunnel oxide layer 14, a floating gate 16, a buried control gate 18, a low voltage access transistor 20, and a floating gate transistor 22 that shares floating gate 16. Operation of cell 10 may be understood by those skilled in the art with reference to the following table:

TABLE 1

| SINGLE POLY EEPROM CELL SCHEMATIC | | | | | |
|---|---|---|---|---|---|
| | HV BL | LV BL | PA | PB | WL |
| PROGRAM | $V_{pp}$-$V_{th}$ | $V_{cc}$ | $V_{ss}$ | $V_{ss}$ | $V_{pp}$ |
| ERASE | $V_{ss}$ | $V_{cc}$ | $V_{pp}$ | $V_{ss}$ | $V_{pp}$ |
| READ | $V_{ss}$ | 2.0 | $V_{ss}$ | $V_{ss}$ | $V_{cc}$ |

The following definitions as used in Table 1 shall apply:

HV BL=High Voltage Bit Line;

LV BL=Low Voltage Bit Line;

PA=Phase A of a clock;

PB=Phase B of the clock;

WL=Word Line of the cell;

$V_{pp}$=Programing Voltage;

$V_{cc}$=Device Operating Voltage; and, $V_{ss}$=Ground Potential

It should be noted that cell 10 is representative of the art—it is a single poly design—only floating gate 16 is of polycrystalline silicon material. A separate isolation transistor 20 is included in the memory cell in the read path. Further, transistor 12 is included in cell 10 in order to isolate tunnel oxide 14/floating gate 16 from the high voltage on HV BL when cell 10 is unselected. It should be appreciated that transistor 12, to withstand conventional high voltages on HV BL (e.g., 15 volts), includes source and drain junctions of special design (i.e., much wider diffusion pitches, etc.). Accordingly, precious area is occupied. In sum, the 4.5 transistor design illustrated in FIG. 1 is rather complex, which leads to lower memory cell density, and higher cost—in all, a less competitive product.

Accordingly, there is need to provide an improved memory structure suitable for use in a memory device, such as a flash EEPROM device, that minimizes or eliminates one or more of the problems as set forth above.

SUMMARY OF THE INVENTION

It is an object of the present invention to provide an EEPROM device that addresses the "over-erase" problem while avoiding the cost and complexity associated with conventional approaches.

A memory cell in accordance with this invention achieves the above-mentioned object while, in addition, providing a reduced cell size as compared with conventional cell designs. These improvements are achieved by realizing a single poly floating-gate structure having a buried plate control gate. The buried control gate is responsive to externally applied potentials for controlling programming and reading operations of the cell. A split-gate transistor includes a floating gate portion that is operatively coupled to the buried control gate. The combination of a split gate transistor and a buried control gate overcomes the complexity found in the prior art while providing the necessary functionality demanded in the marketplace.

In a preferred embodiment, a device in accordance with this invention includes a semiconductor substrate of a first connectivity type, preferably p-type silicon. Source and drain regions of a second conductivity type opposite the first conductivity type, preferably n-type silicon, are formed in the substrate and are spaced apart to define a channel region therebetween. The channel region includes a first portion that extends from the drain region towards the source region and forms part of a select or isolation gate. The channel further includes a second region extending between the first region and the source and forms part of a read transistor. The buried control gate region, preferably n-type silicon, is formed in the substrate and spaced apart from the source, drain, and channel. A layer of dielectric material, preferably an oxide of silicon, is formed over the substrate, and includes a tunnel dielectric region extending over the abovementioned second region of the channel and at least a portion of the source. The tunnel oxide has a thickness that is less than the thickness of the oxide overlying the remainder of the channel and the drain region.

A floating gate, preferably of polycrystalline silicon (poly) is disposed on the layer of oxide, and includes a first portion extending over the channel and a second portion extending over the buried control gate. The select transistor is formed in the first region of the channel to prevent undesirable turn-on resulting from a prior over-erasure of the floating gate when the memory cell is unselected (i.e., performs an isolation function when the memory cell is unselected). The read transistor is formed in the second region of the channel for determining a memory state when the memory cell is selected. The select transistor has a threshold voltage ($V_t$) that is higher than the read transistor due to the thicker oxide layer of the gate. This higher $V_t$ provides the select or isolation function. Programming occurs by Channel Hot Electron Injection in the drain region, while erasure (i.e., removal of electrons from the floating gate) occurs by way of the well-known Fowler-Nordheim tunneling mechanism through the thin oxide near the source region of the split-gate transistor.

Other objects, features, and advantages of the present invention will become apparent to one skilled in the art from the following detailed description and accompanying drawings illustrating features of this invention by way of example, but not by way of limitation.

DETAILED DESCRIPTION OF THE PREFERRED EMBODIMENT

Figure 2:
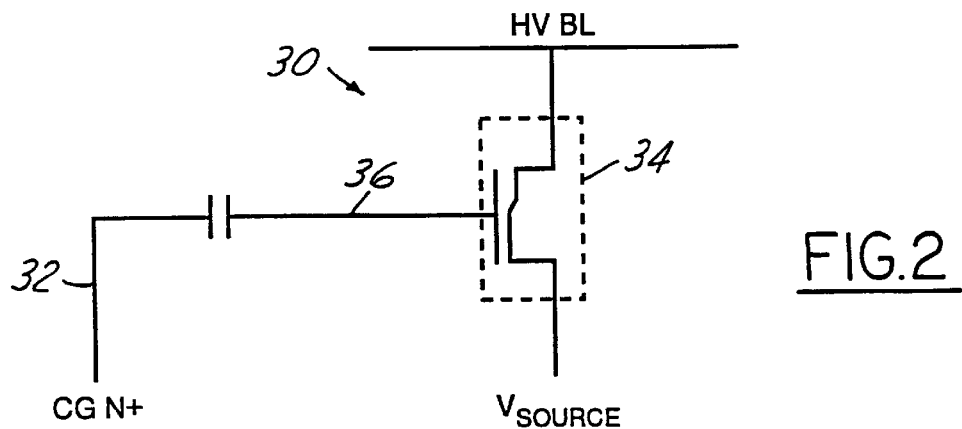
FIG. 2 is a simplified schematic diagram view of a preferred memory cell embodiment of the present invention.

Referring now to the drawings wherein like reference numerals are used to identify identical components in the various views, FIG. 2 showed a preferred memory cell embodiment in accordance with the present invention, memory cell 30. Memory cell 30 includes a buried control gate 32, and a split gate transistor 34 that includes a floating gate portion 36. Control gate 32 is responsive to externally applied voltage potentials for controlling programming and read operations of cell 30. Floating gate 36 is operatively coupled to control gate 32 and forms part of split gate transistor 34. Floating gate 36 contains a first portion 36a, and a second portion 36b (best shown in FIG. 3).

The following abbreviations shall apply in reference to FIG. 2:

HV BL=High Voltage Bit Line;

CG=Control Gate; and, $V_{source}$=Potential on the Source Terminal of Split-gate Transistor 34

Memory cell 30 is suitably provided for storing binary data having two possible states and is suitable for use in EEPROM cell structures as used in many different applications. Thus, in the configuration shown in FIG. 2, memory cell 30 may form part of a larger array (i.e., rows and columns) of memory cells 30 wherein memory cells in a row have respective control gates attached to a common word line WL, while memory cells 30 in a common column may have their respective high voltage bit lines HV BL connected to a column bit line. This use of memory cell 30 is exemplary only; cell 30 may be used in other applications as well (e.g., programmable logic devices—PLDs).

A better understanding of the present invention may be obtained by way of reference to the detailed structure of the preferred embodiment. Accordingly, reference is now made to FIGS. 3–6.

Figure 3:
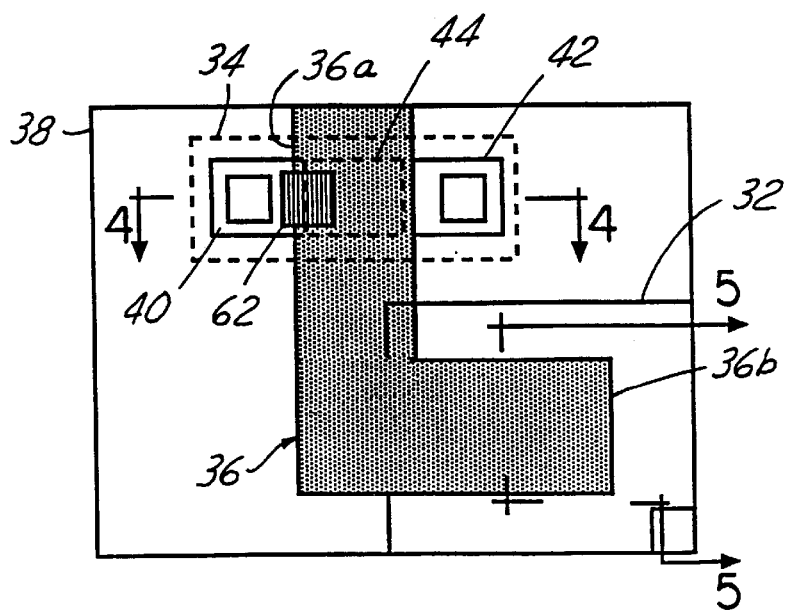
FIG. 3 is a top layout view of the semiconductor structure corresponding to the preferred memory cell embodiment shown in FIG. 2.

FIG. 3 is a top layout view of the preferred memory cell embodiment which is shown schematically in FIG. 2. FIG. 3 has been included to enable those of ordinary skill in the art to make and use the present invention, and, to provide a road map for facilitating the reader in correlating the following FIGS. 4 and 5. For reasons that will become apparent below, the area of cell 30 is significantly reduced compared to conventional designs. The area occupied by a constructed embodiment of cell 30, as shown in FIG. 3, is 5.25×5.6 $\mu$M, or approximately 29 square microns using 0.65 $\mu$M design rules. Further reductions in area are contemplated when cell 30 is implemented using increasingly reduced design rules (e.g., 18 square microns using 0.5 μM rule, etc.). Comparable conventional designs (i.e., those that are functionally equivalent), such as that of cell 10 in FIG. 1, range anywhere from 110 square microns to 220 square microns or more. This significant reduction is extremely important for a variety of reasons that should be apparent to those skilled in the art (i.e., higher density, higher performance per unit price, etc.).

Cell 30 includes a semiconductor substrate 38 of a first conductivity type, a source region 40 formed in substrate 38 of a second conductivity type opposite the first conductivity type, and a drain region 42 formed in substrate 38 of the second conductivity type, wherein source 40, and drain 42 are spaced apart to define a channel region 44 therebetween.

Figure 4:
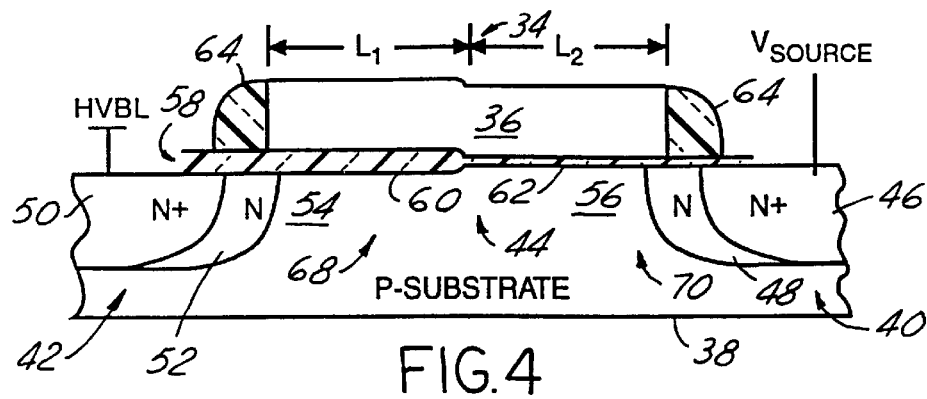
FIG. 4 is a simplified exaggerated cross-sectional view taken substantially along line 4—4 of FIG. 3 illustrating a single-poly split-gate structure employing a thick oxide, and a thin oxide according to the present invention.

FIG. 4 corresponds to a section taken into the paper, perpendicular to floating gate portion 36 and taken substantially along line 4—4 as shown in FIG. 3, and viewed in the direction of the arrows. FIG. 4 shows the general structure of the split-gate transistor portion 34 of memory cell 30. Substrate 38 is preferably p-type silicon. Conventional field oxide regions (not shown) are included to isolate split-gate transistor 34 from other split-gate transistors 34 in other memory cells 30 formed in and on the same substrate 38, and may comprise silicon dioxide material about 5000 Å thick.

As best shown in FIG. 4, source 40 includes a heavily doped N+ ohmic contact region 46, and a slightly underlying, lightly doped N-type region 48 extending generally from region 46 towards drain region 42. Similarly, drain region 42 includes a heavily doped N+ ohmic contact region 50, and slightly underlying, lightly doped N-type region 52 extending generally from region 50 towards source region 40. Regions 46/48, and 50/52 are provided for improving the punchthrough characteristics of the device. That is, when the drain/source is at a high enough voltage with respect to source/drain, the depletion region may extend across the channel, thus causing current to flow irrespective of the gate voltage (i.e., even if it is zero). This is known as a punchthrough condition. The described N+/N structure is provided for reducing the electric field in the respective drain and source depletion regions. Ohmic N+ contacts 46 and 50 may comprise doped regions in substrate 38 having arsenic in an average concentration in the range of $10^{15}$–$10^{16}$ atoms per square centimeter, and is preferably is $10^{16}$ atoms per square centimeter. Likewise, N-type regions 48, and 52 may be doped in an average concentration in the range of $10^{14}$–$10^{15}$ atoms per square centimeter, and preferably are doped to have an average concentration of approximately $10^{15}$ atoms per square centimeter. It should be appreciated by those of ordinary skill in that art that other N-specie impurities may be used in forming both source region 40, and drain region 42; similarly, doping may also be varied to some extent and remain within the spirit and scope of the present invention.

Channel 44 is basically divided into two regions: a first region 54 for forming a select or access transistor, and a second region 56 for forming a floating gate or read transistor.

A layer of dielectric material 58, such as an oxide of silicon, is formed over substrate 38. Layer 58 includes a thick oxide region 60 formed over the region 54 of channel 44, and a thin tunnel oxide (dielectric) region 62 extending over second region 56 and over at least a part of source region 40. Preferably, thick oxide 60 is silicon dioxide material that may have a thickness of about 145 Å–300 Å, and is preferably 190 Å, while thin oxide region 62 is silicon dioxide material that may have a thickness of about 70–100 Å, and is preferably 80 Å thick.

Floating gate 36 preferably comprises polycrystalline silicon material (hereinafter "poly"). Floating gate 36 may have a thickness in the range of 1.0–2.0 k angstrom, and is 2 k angstrom in the preferred embodiment. Floating gate 36 is preferably doped N+ such that it has a sheet resistance of about 80–150 ohms per square. Selection of an appropriate dopant, and determining the magnitude of same to obtain these resistance values requires no more than routine application of ordinary skill in the semiconductor fabrication field of endeavor. First portion 36a extends generally over channel 44, while second portion 36b extends generally over buried control gate 32.

Figure 5:
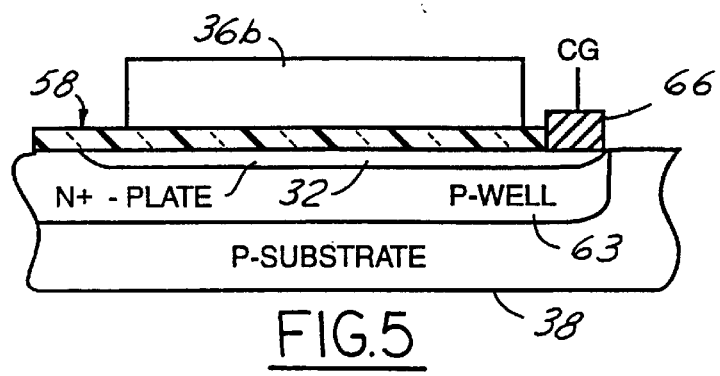
FIG. 5 is a simplified exaggerated cross-sectional view taken substantially along line 5—5 of FIG. 3 illustrating a buried plate used as a control gate in accordance with the present invention.

Referring now to FIG. 5, a well region, such as P-well 63, is formed in substrate 38. Buried control gate region 32 is of a conductivity type opposite substrate 38, and is preferably N-type silicon. Formation of such an N-plate, including appropriate selection and concentration of impurities, is well-known in the art. The buried control gate 32 (hereinafter "CG N+ 32") is connected to a control gate signal by way of a contact 66, which may be a metal contact 66.

Referring now to FIGS. 4, and 5, and by way of explanation, CG N+ 32 performs the function of the second layer of poly (i.e., the control gate) described in connection with conventional double poly split gate structures in the Background section. That is, the application of a voltage to contact 66, and thus to CG N+ 32, by capacitive coupling, induces a potential on floating gate 36. Thus, the application of a positive voltage to CG N+ 32 will capacitively couple a positive voltage to floating gate 36. The degree of capacitive coupling has been investigated in the art, as, for example, in U.S. Pat. No. 4,649,520, issued to Eitan, on Mar. 10, 1987, and hereby incorporated by reference.

Referring particularly now to FIG. 4, the split-gate structure illustrated therein forms two series-connected transistors: first, a select or access transistor 68 formed by region 54, thick oxide region 60, and floating gate 36, while a second, read or floating gate transistor 70 is formed by region 56, thin or tunnel oxide region 62, and floating gate 36. Drain region 42 connects to the drain of transistor 68, source region 40 connects to the source of transistor 70, while the transistors 68 and 70 are connected by way of channel 44.

Figure 6:
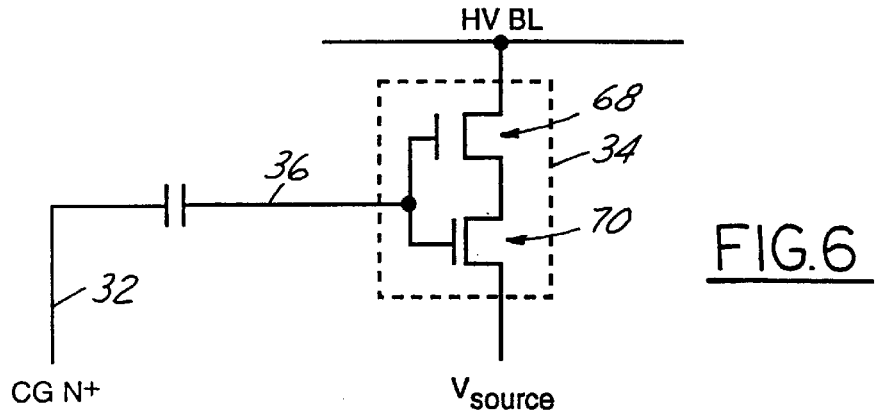
FIG. 6 is a simplified schematic diagram view showing an electrical equivalent circuit of the memory cell shown schematically in FIG. 2.

It is a fundamental principle that the threshold voltage of a field effect transistor, such as transistor 68, and 70, varies as a function of the oxide thickness of the gate. Accordingly, since oxide 60 is thicker than the oxide 62, the threshold voltage for transistor 68 is higher than the threshold voltage for transistor 70. The higher threshold voltage of transistor 68 thus effectively and efficiently addresses the "over-erase" problem described in the Background section. In particular, if the floating gate 36 of memory cell 30 is "over-erased" then the net positive charge may be sufficient to maintain transistor 70 in a conductive state (i.e., depletion mode device), notwithstanding the fact that no positive potential is being applied to the control gate by way of CG N+ 32. However, since the thick oxide 60 raises the threshold voltage of transistor 68, "over-erase" encountered due to manufacturing tolerances, etc., would be insufficient to induce the well-known inversion channel in region 54; accordingly, transistor 68 is maintained in a non-conductive (truly enhancement-mode device). FIG. 6 shows the electrical equivalent circuit of split-gate transistor 34.

The split-gate structure 34 is preferably engineered in accordance with the following gate lengths: the gate length indicted $L_1$ (i.e., for the gate length of transistor 68) is equal to 0.9 microns plus LV, while the gate length $L_2$ (i.e., for read transistor 70) is equal to 0.3 microns plus LV, where LV equals a Lynch value of 0.25 microns. The above gate lengths apply when split-gate transistor 34 is used for programming, erasing, and reading.

Referring now to FIGS. 3–5, a description of the operation of the preferred memory cell embodiment 30, shown schematically in FIG. 2, will now be set forth in detail. Biasing conditions established in Table 2 will apply to the PROGRAM, ERASE, and READ modes of operation of cell 30.

TABLE 2

MEMORY CELL 30 BIASING CONDITIONS
WHEN USED WITH STRUCTURE 34

|  | HV BL | $V_{source}$ | CG N+ |
|---|---|---|---|
| PROGRAM | $V_{pp}$ | $V_{ss}$ | $V_{pp}$ |
| ERASE | $V_{ss}$ | $V_{pp}$ | $V_{pp}$ |
| READ | $V_{ss}$ | 2.0 | $V_{ss}$ |

To program cell 30, the biasing conditions as described in Table 2 are applied to cell 30. In particular, $V_{pp}$ may be 11.5V, $V_{cc}$ may be 5.0V, and $V_t$ may be 1.3V. As shown most clearly in FIG. 4, floating gate 36 is charged using Channel Hot Electron programming. In particular, with source 40 grounded, and programming voltage $V_{pp}$ applied to the high voltage bit line HV BL, a relatively large programming current flows from drain-to-source, or, in other words, electrons are accelerated to flow from source-to-drain. The programming (high) voltage applied by way of CG N+ 32 is coupled to floating gate 36; accordingly, electrons gain sufficient energy to jump the silicon-silicon dioxide energy barrier, penetrating the oxide 60 and flowing to floating gate 36, which is itself completely surrounded by oxide. The injected electrons cause a predetermined voltage increase in the threshold of transistors 68, and 70.

During ERASE mode, with the biasing conditions established as described in Table 2, erasure (i.e., removal of charge from floating gate 36) occurs through tunnel oxide 62. As best shown in FIG. 4, this erasure occurs by way of Fowler-Nordheim tunneling of electrons from floating gate 36 through thin tunnel oxide 62 into source 40.

During the READ mode of operation, with the biasing conditions established as described in Table 2, cell 30 exhibits one of two predetermined responses in accordance with the preexisting charge on floating gate 36. When floating gate 36 has been programmed (i.e., "charged"), neither transistor 68, nor transistor 70, will turn-on in response to Vcc being applied to CG N+ 32. Therefore, no current will flow from source-to-drain in split-gate transistor 34. In contrast, when floating gate 36 has not been programmed (i.e., not "charged"), both transistors 68, and 70 will be turned-on and a read current $I_{dsr}$ will flow from the source terminal of split-gate transistor 34 to the bit line HV BL. For example, the high voltage bit HV BL may be coupled to a current sense amplifier (not shown) that continuously monitors the bit line for current. The sense amp is configured having a predetermined threshold, and will be triggered when the read current $I_{dsr}$ exceeds the predetermined threshold level. When the sense amplifier is triggered, its output changes state. The output state of the sense amplifier is indicative of the state of the selected cell. It should be further observed, that when cell 30 is unselected, it cannot contribute current to the bit line due to select transistor 68, and therefore disturb the reading of the state of the selected memory cell. As described above, if the floating gate 36 has been "over-erased" then transistor 70 may take the form of a depletion mode device (i.e., a device that remains "on" under normal operating voltages applied to the control gate). However, transistor 68, since its threshold voltage is higher, is unaffected by the "over-erase" of the floating gate. In particular, when cell 30 is unselected, the CG N+ 32 is grounded (i.e., $V_{ss}$), and thus, transistor 68 will not turn on, even though transistor 70 would have conducted current but for the inclusion of select transistor 68.

Figure 1:
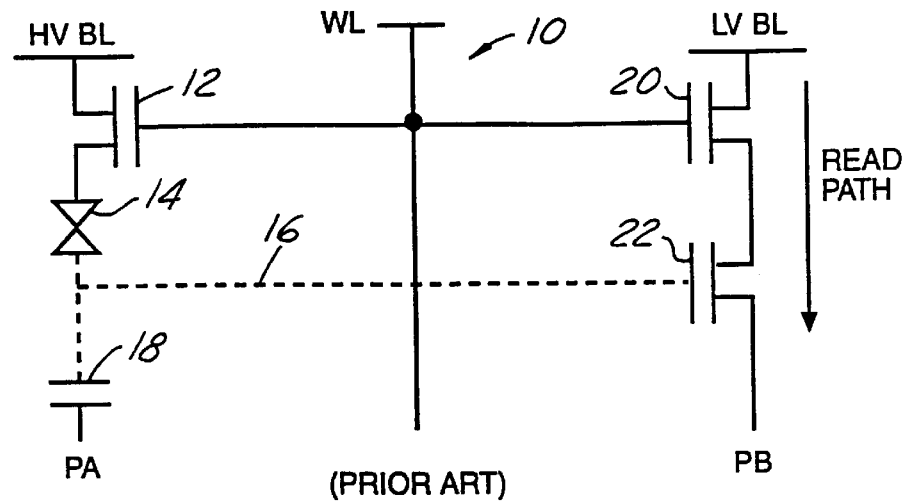
FIG. 1 is a simplified diagrammatic and schematic view of a prior art 4.5 transistor single poly EEPROM cell.

In sum, transistor 34 performs programming, erasure, reading, and isolation functions (when unselected). This high level of integration permits a significant level of reduction in area, especially as compared to the conventional approach illustrated by memory cell 10 (FIG. 1).

Although cell 30, particularly the structure relating to split-gate transistor 34, may be formed in any one of a plurality of conventional methods known to those of ordinary skill in the art, preferably, the following steps are involved in constructing memory cell 30. The active areas (54, 56) of split-gate transistor 34 are first formed. A layer of dielectric silicon dioxide approximately 145 Å (i.e., region 60) is then grown on substrate 38. Next, a periphery gate mask is used to clear the active areas outside the memory core. After an oxide dip step, which is conventional and known in the art, a thin gate oxide (70–150 Å) is then grown in the periphery. This step boosts the total thickness of the oxide in the area 60 to approximately 200–325 Å, as shown in FIG. 4. Next, a standard cell threshold voltage $V_t$, and periphery threshold voltage $V_t$, adjust implants are done. Next, a tunnel mask is used to pattern the thin or tunnel oxide 62, as shown in FIGS. 3, and 4. Next, the buried n+ implants are done using this mask. After a resist strip step, which is conventional and well-known in the art, the tunnel mask area indicated at 62 is subject to a preclean step, which is also conventional and well-known in the art, that reduces the oxide thickness in the area 60 to approximately 100–200 Å. Following this step, a quality dielectric 70–100 Å thick is formed. This quality dielectric step increases the thickness of thick oxide region 60 back into the range of 170–300 Å thick while the tunnel oxide region 62 becomes 70–100 Å thick. Next, a polysilicon layer 36 is formed and patterned. The transistors and periphery devices are formed subsequent to the foregoing, using standard, prior art CMOS process steps.

Figure 7:
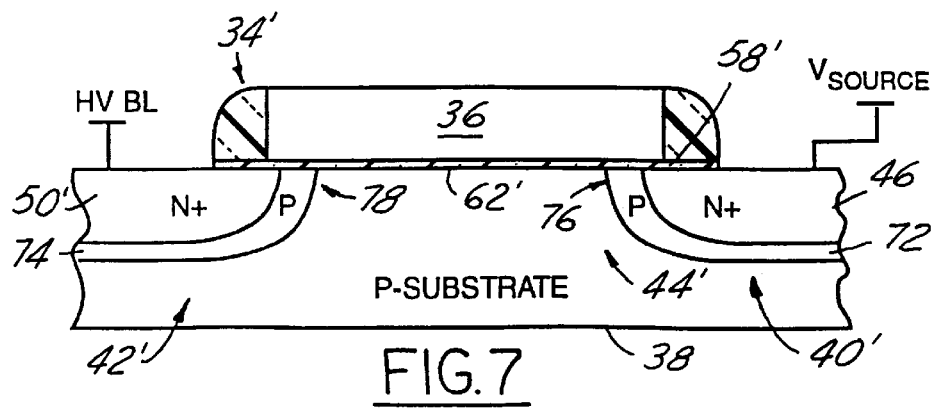
FIG. 7 is a simplified exaggerated cross-sectional view of an alternate embodiment of the single poly split floating gate structure shown in FIG. 4.

Referring now to FIG. 7, an alternate embodiment of the split-gate structure shown in FIG. 4 is depicted. Alternate split-gate transistor 34' includes a semiconductor substrate 38, preferably p-type, a source region 40', a drain region 42' separated from source region 40' to define a low threshold channel region 44' therebetween. Source region 40' includes highly doped N+ ohmic contact region 46', and an underlying p-doped region 72. Similarly, drain region 42' includes a highly doped N+ ohmic contact region 50', and an underlying p-type region 74. Regions 72, and 74 are more highly doped than substrate 38. Split-gate transistor 34' further includes a layer of dielectric 58', including a thin tunnel dielectric portion 62', preferably made of silicon oxide material having a thickness in the range of about 70–100 Å, and is preferably about 80 Å. Transistor 34' further includes floating gate 36.

The principle behind the operation of split-gate transistor 34' is that the more highly doped regions 72, and 74 form junctions indicated generally at 76, and 78 that have a higher threshold voltage than the pn junctions formed between substrate 38 and regions 46', and 50'. Accordingly, even when floating gate 36 has been "over-erased," the net positive charge existent thereon is insufficient to form a channel from source region 40' to drain region 42'.

Accordingly, when a memory cell including split-gate transistor 34' is unselected, no leakage currents will flow. The biasing conditions established and set forth in Table 3 apply to the PROGRAM, ERASE, and READ modes of operation of cell 30 when having split floating gate transistor 34' used in place of split gate transistor 34, as shown in FIG. 4.

TABLE 3

MEMORY CELL 30 BIASING CONDITIONS
WHEN USED WITH TRANSISTOR 34'

|  | HV BL | $V_{source}$ | CG N+ |
|---|---|---|---|
| PROGRAM | $V_{pp}$ | $V_{ss}$ | $V_{pp}$ |
| ERASE | $V_{ss}$ | $V_{pp}$ | $V_{ss}$ |
| READ | $V_{ss}$ | 2.0 | $V_{cc}$ |

The description of the PROGRAM, ERASE, and READ operations of cell 30 equipped with transistor 34' is identical to that described above in connection with cell 30 having split-gate transistor 34.

Figure 8:
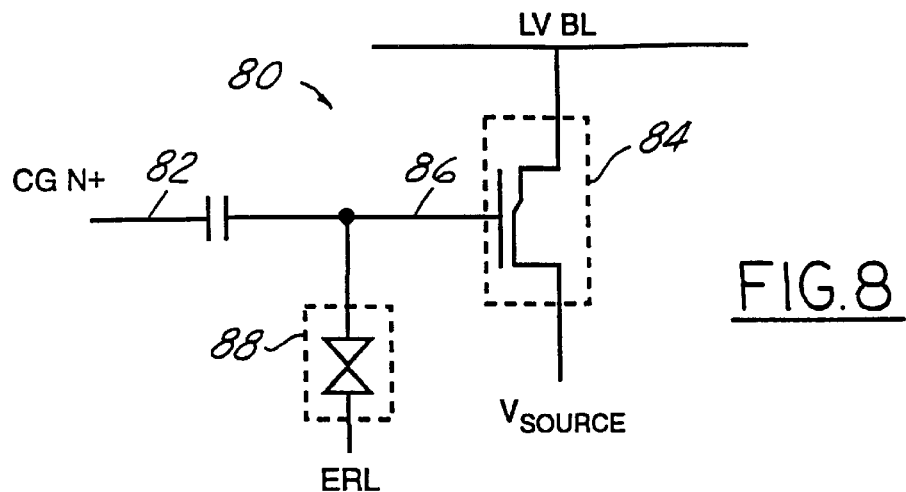
FIG. 8 is a simplified schematic diagram view of an alternate embodiment of the memory cell of FIG. 2 according to the present invention, including particularly an erase node that is separate from the select transistor.

Referring now to FIG. 8, a further embodiment, memory cell 80, is illustrated. Cell 80 includes a buried control gate 82 (hereinafter "CG N+ 82"), a split-gate transistor 84 (preferably employing the structure of split-gate transistor 34), a floating gate 86 including a first portion 86a, a second portion 86b, and a third portion 86c (portions 86a, 86b, and 86c best shown in FIG. 9), and an erase node 88. The following shall apply in reference to FIG. 8:

LV BL=Low Voltage Bit Line;

CG N+=Control Gate;

ERL=Erase Line; and $V_{source}$=potential on the source terminal of split gate transistor 84.

Memory cell 80 is substantially identical to memory cell 30 except that it further includes a separate erase node 88 separate and spaced apart from split-gate transistor 84.

Figure 9:
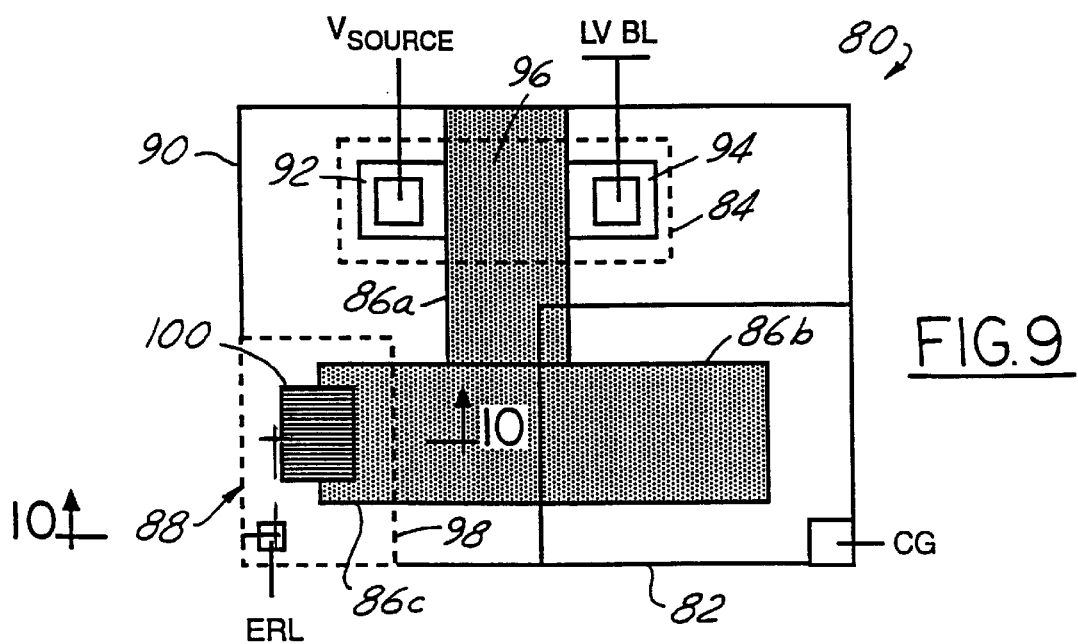
FIG. 9 is a top layout view of the semiconductor structure corresponding to the alternative memory cell embodiment shown in FIG. 8.
Figure 10:
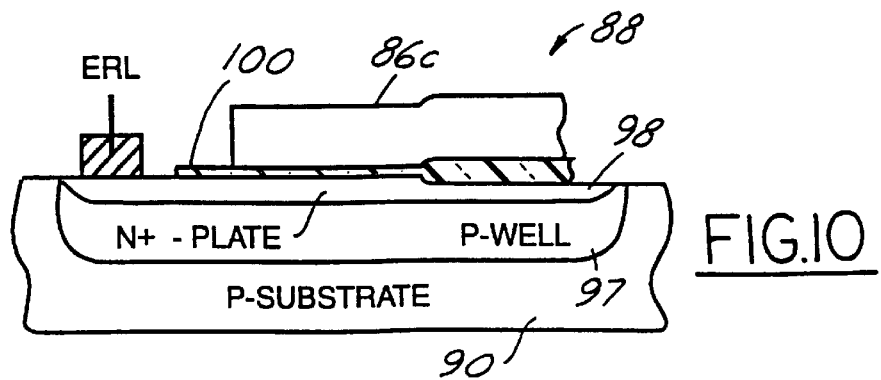
FIG. 10 is a simplified exaggerated cross-sectional view taken substantially along line 10—10 in FIG. 9 illustrating a portion of the erase node structure of the alternate memory cell embodiment, shown schematically in FIG. 8.

Referring now to FIGS. 9 and 10, memory cell 80 includes substrate 90, preferably p-type silicon, generally asymetric source and drain regions, particularly a source region 92, a drain region 94 spaced apart from source region 92 to define a channel region 96 therebetween, a buried P-type well region 97, a buried N-type plate 98 defining an erase node control gate, and tunnel dielectric 100, preferably tunnel oxide 100. Tunnel oxide may be silicon dioxide material having a thickness in the range of 70–100 Å, preferably 80 Å. The operation of cell 80 may be understood by those of ordinary skill in the art with reference to Table 4.

TABLE 4

BIASING CONDITIONS FOR CELL 80
HAVING SPLIT GATE TRANSISTOR 34

|  | LV BL | CG N+ | ERL | RPT |
|---|---|---|---|---|
| PROGRAM | $V_{pp}-2V_{th}$ | $V_{pp}$ | $V_{ss}$ | $V_{ss}$ |
| ERASE | $V_{ss}$ | $V_{ss}$ | $V_{pp}$ | $V_{ss}$ |
| READ | $V_{ss}$ | $V_{cc}$ | $V_{cc}$ | 2.0 |

As mentioned above, cell 80 is identical to cell 30, except that cell 80 includes a separate erase node 88. Since erasure occurs by way of node 88, rather than by way of tunnel oxide 62 (when using split gate transistor 34), the gate lengths may be reduced to reflect the low voltage nature of the LV BL junction. Particularly, for memory cell 80 when split gate transistor 34 is employed, the following gate lengths apply:

Transistor 68: 0.2 microns

Transistor 70: 0.4 microns plus LV, where LV equals a Lynch value of 0.25 microns.

With reference to Table 4, and with $V_{pp}$, $V_{cc}$, and $V_t$ assuming the nominal values described above, programming still occurs through transistors 68, and 70 using Channel Hot Electron Programming in the manner described above.

During ERASE mode, however, with the biasing conditions established as described in Table 4, erasure occurs through erase node 88. In particular, erasure occurs by way of Fowler-Nordheim tunneling of electrons from floating gate 86 (particularly portion 86c) through tunnel oxide 100 into n⁺-plate 98 and to the erase line ERL.

Reading of the cell 80 occurs in a fashion identical to that described above in connection with memory cell 30. Use of a separate erase node permits a reduction in the area occupied by split-gate transistor 84 since only relatively low voltages are required to be applied to the low voltage bit line LV BL.

A fourth embodiment in accordance with the present invention uses the memory cell 80 as shown in FIG. 8, with split gate transistor 34', as shown in FIG. 7, being substituted for split-gate transistor 34. The operation of such an embodiment may be understood by those of ordinary skill in the art with reference to Table 5.

TABLE 5

BIASING CONDITIONS FOR CELL 80
WHEN USED WITH SPLIT-GATE TRANSISTOR 34'

|  | LV BL | CG N+ | ERL | RPT |
|---|---|---|---|---|
| PROGRAM | $V_{pp}-2V_{th}$ | $V_{pp}$ | $V_{ss}$ | $V_{ss}$ |
| ERASE | $V_{ss}$ | $V_{ss}$ | $V_{pp}$ | $V_{ss}$ |
| READ | $V_{ss}$ | $V_{cc}$ | $V_{cc}$ | 2.0 |

Operation of cell 80 when used with split-gate transistor 34' is identical to the operation described above in connection with cell 80 when used with split-gate transistor 34.

While the invention has been particularly shown and described with reference to the preferred embodiments thereof, it is well understood by those skilled in the art that various changes and modifications can be made in the invention without departing from the spirit and scope of the invention.

We claim:

1. A non-volatile memory cell, comprising:

a buried control gate responsive to externally applied potentials for controlling programming and retrieval operations of the cell; and, a transistor having a floating gate portion operatively coupled to said buried control gate, a source region, a drain region, a channel formed between said source and drain regions, and a layer of dielectric material disposed over said source region, drain region and said channel, said floating gate portion being disposed over said layer, said layer including a tunnel dielectric region extending over a portion of said channel and one of said source and drain regions, said tunnel dielectric region being thinner than the remainder of said layer of dielectric material such that said transistor inhibits conduction through said channel when said memory cell is unselected if said floating gate becomes over-erased.

2. The memory cell of claim 1 wherein said transistor further includes an erase node portion for erasing the memory cell.

3. The memory cell of claim 1 further comprising an erase node spaced apart from said transistor for erasing the memory cell.

4. A non-volatile memory cell comprising:
a buried control gate responsive to externally applied potentials for controlling programming and retrieval operations of the cell; and,
a split gate transistor having a floating gate portion operatively coupled to said buried control gate, said split gate transistor including:
a substrate of a first conductivity type;
a source region including a first portion of a second conductivity type opposite said first conductivity type;
a drain region including a first portion of said second conductivity type, said source region and said drain regions being spaced apart to define a channel therebetween;
said source region further including a second portion of said first conductivity type, said second portion of said source region extending from said first portion of said source region towards said drain region to thereby form a first relatively high threshold junction; and,
said drain region further including a second portion of said first conductivity type, said second portion of said drain region extending from said first portion of said drain region towards said source region to thereby form a second relatively high threshold junction, wherein said first and second relatively high threshold junctions inhibit conduction through said channel which may otherwise occur due to over-erasure of said floating gate.

5. A memory cell comprising:
a semiconductor substrate of a first conductivity type;
a source region of a second conductivity type opposite said first conductivity type formed in said substrate;
a drain region of said second conductivity type formed in said substrate, said source and drain regions being spaced apart to define a channel region therebetween;
said channel having a first region extending from said drain region toward said source region and a second region between said first region and said source region;
a buried control gate region of said second conductivity type formed in said substrate spaced from said source region, said drain region, and said channel;
a layer of dielectric material formed over said substrate, said layer including a first tunnel dielectric region extending over said second region and at least a portion of said source region, said first tunnel dielectric region having a thickness that is less than the thickness of said layer overlying said drain region and said first region of said channel; and,
a floating gate disposed on said layer of dielectric material, including a first portion extending over said channel and a second portion extending over said buried control gate wherein a select transistor is formed including said first region of said channel to prevent an over-erase of said floating gate from causing turn-on when said memory cell is unselected, and a read transistor is formed including said second region of said channel for determining a memory state when said memory cell is selected.

6. The memory cell of claim 5 wherein said select transistor is used to program said memory cell by allowing electrons to be injected through said dielectric layer to said floating gate; and, said first tunnel dielectric region is used to erase said memory cell by allowing electrons to be removed from said floating gate through said first tunnel dielectric region into said source region.

7. The memory cell of claim 6 wherein said first conductivity type is p-type silicon, and said second conductivity type is n-type silicon.

8. The memory cell of claim 7 wherein said source region and said drain region each include a relatively heavily doped $n^+$ part and a relatively lightly doped n part for improving punchthrough characteristics.

9. The memory cell of claim 5 further including an erase node region of said second conductivity type formed in said substrate and spaced apart from said buried control gate region and said drain and source regions, said layer of dielectric further including a second tunnel dielectric region disposed over said erase node region, said floating gate further including a third portion extending over said second tunnel dielectric region, wherein
said select transistor is used to program said memory cell by allowing electrons to be injected through said dielectric layer to said floating gate; and,
said second tunnel dielectric region is used to erase said memory cell by allowing electrons to be removed from said floating gate through said second tunnel dielectric region into said erase node region.

10. The memory cell of claim 9 wherein said first conductivity type is p-type silicon and said second conductivity type is n-type silicon.

11. An electrically-erasable programmable read-only memory (EEPROM) cell having a semiconductor substrate of a first conductivity type, comprising:
a source region formed in said substrate and including a first portion of a second conductivity type opposite said first conductivity type, and a second portion of said first conductivity type extending from said first portion toward said drain region, said second portion being more heavily doped than said substrate;
a drain region formed in said substrate and including a first portion of said second conductivity type and a second portion of said first conductivity type extending from said first portion of said drain region towards said source region, said second portion of said drain region being more heavily doped than said substrate, said source region and said drain regions being spaced apart to define a channel therebetween;
a buried control gate region of said second conductivity type formed in said substrate spaced from said source region, said drain region, and said channel;
a layer of dielectric material formed over said substrate including a first portion extending over said drain region, channel, and source region; and,
a floating gate disposed on said layer of dielectric material, including a first portion extending over said channel and a second portion extending over said buried control gate, wherein said first and second portions of said source region and said first and second portions of said drain region form respective junctions having associated therewith a first threshold that is greater in magnitude than a second threshold associated with said channel to prevent an over-erase of said floating gate from causing turn-on when said memory cell is unselected.

12. The memory cell of claim 11 further including an erase node region of said second conductivity type formed in said substrate and spaced apart from said buried control gate region and said drain and source regions, said layer of dielectric further including a second portion extending over said erase node region, said floating gate further including a third portion extending over said erase node region, wherein said first portion of said dielectric layer is used to program said memory cell by allowing electrons to be injected through said dielectric layer to said floating gate; and, said second portion of said layer of dielectric material is used to erase said memory cell by allowing electrons to be removed from said floating gate through said second portion of said dielectric layer into said erase node region.

* * * * *